United States Patent

Cheng

[11] Patent Number: 6,148,907
[45] Date of Patent: Nov. 21, 2000

[54] HEAT EXCHANGE STRUCTURE FOR A HEAT SOURCE

[75] Inventor: Tui-Hung Cheng, Kaohsiung, Taiwan

[73] Assignee: Yen Sun Technology Corp., Kaohsiung Hsien, Taiwan

[21] Appl. No.: 09/443,894

[22] Filed: Nov. 19, 1999

[51] Int. Cl.$^7$ ....................................................... H05K 7/20
[52] U.S. Cl. .......................... 165/121; 361/695; 361/696
[58] Field of Search .................................... 165/80.3, 121, 165/185; 454/184; 361/695, 696; 257/721

[56] References Cited

U.S. PATENT DOCUMENTS

| | | | |
|---|---|---|---|
| 4,147,299 | 4/1979 | Freeman | 236/49.5 |
| 5,107,398 | 4/1992 | Balley | 165/80.3 |
| 5,422,787 | 6/1995 | Gourdine | 361/697 |
| 5,497,825 | 3/1996 | Yu | 165/11.1 |
| 5,566,377 | 10/1996 | Lee | 361/695 |
| 5,917,697 | 1/1998 | Wang | 361/695 |

*Primary Examiner*—Allen Flanigan
*Attorney, Agent, or Firm*—Dougherty & Troxell

[57] ABSTRACT

A heat exchange device includes a case-shaped cover directly contact on a heat source to exchange heat, an air-in tube having one end connected to the cover, a fan fixed on an outer wall of a case of an appliance having the heat source and connected to the air-in tube, and an air-out tube having one end connected to the cover and the other end extending out of the case of the appliance to outer air. Then the fan, the air-in tube, the cover and the air-out tube make up a heat exchange route, with cool outer air blown into the air-in tube by the fan, then flowing a round in the cover to flow out of the air-out tube so that hot air within the case of the appliance may be exhausted, not staying therein.

6 Claims, 4 Drawing Sheets

HEAT EXCHANGE STRUCTURE FOR A HEAT SOURCE

BACKGROUND OF THE INVENTION

This invention relates to a heat exchange device for a heat source, particularly to one having high efficiency in dispersing heat from a heat source.

A first kind of conventional heat exchange device shown in FIG. 1 includes a heat dispersing plate 11 tightly laid on a heat source (as shown with dotted lines in FIG. 1), and an electric fan 12 fixed on the heat dispersing plate 11. The heat dispersing plate 11 has a plurality of short dispersing walls 111 spaced apart to be contacted by the wind produced by the fan 12 fixed tightly with screws 121 against the short dispersing walls 111. Though the short dispersing walls may disperse heat of the heat source, the fan 12 and the heat dispersing plate 11 are generally fixed in a case of an electric appliance with heat sources, so the inner air is not easily dispersed or cooled down.

A second kind of conventional heat exchange device shown in FIG. 2, called as a cooling device 2, includes a cover 21 closely laid on a CPU 30 of a computer, an electric fan 21 fixed on an outer wall of a computer case 3, and an air tube 23 connected between the cover 21 and the fan 22. The cover 21 has an air inlet 211 to connect to the air tube 23 to lead outer cool air sent by the fan 22 into the cover 21 to cool the cover transmitting the heat of the CPU and then dispersed into air inside the computer case 3. But heated air still remains in the computer case 3, so the heat dispersing effect is not so high.

SUMMARY OF THE INVENTION

In view of the disadvantage of the conventional heat exchange devices, this invention has been made to offer a heat exchange device for a heat source extremely efficient in dispersing heat.

The feature of the invention is a case-shaped cover closely laid on a heat source for exchanging and dispersing heat, an air-in tube having one end connected to the cover and the other end connected to an electric fan fixed on an outer wall of an appliance having the heat source, and an air-out tube having one end conneced to the cover and the other end extending out of the appliance case. Thus outer cool air is blown by the fan to enter the cover to move round a helical separating wall to move out of an air outlet connected to the air-out tube to the outer air.

BRIEF DESCRIPTION OF DRAWINGS

This invention will be better understood by referring to the accompanying drawings, wherein.

DETAILED DESCRIPTION OF THE PREFERRED EMBODIMENTS

Figure 1:
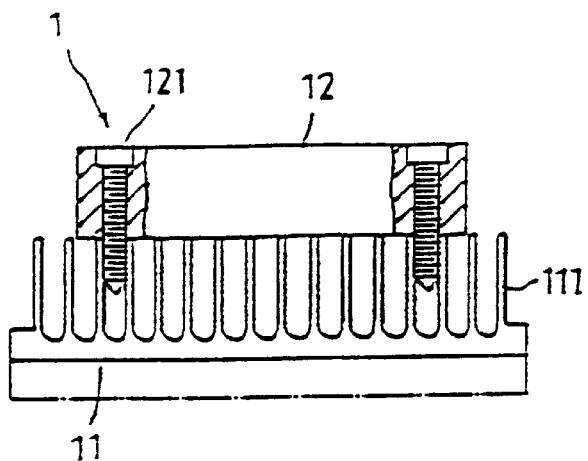
FIG. 1 is a side view of a first kind of conventional heat exchange device for a heat source.
Figure 2:
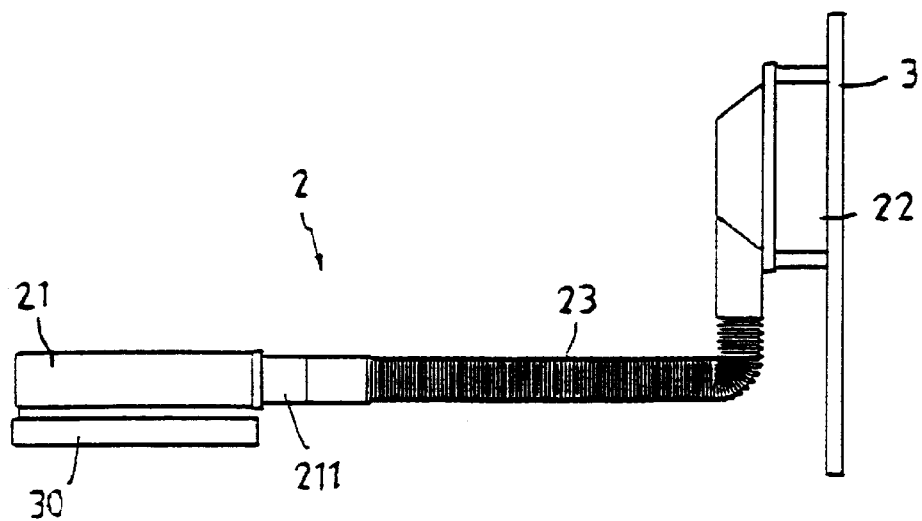
FIG. 2 is a side view of a second kind of conventional heat exchange device for a heat source.
Figure 3:
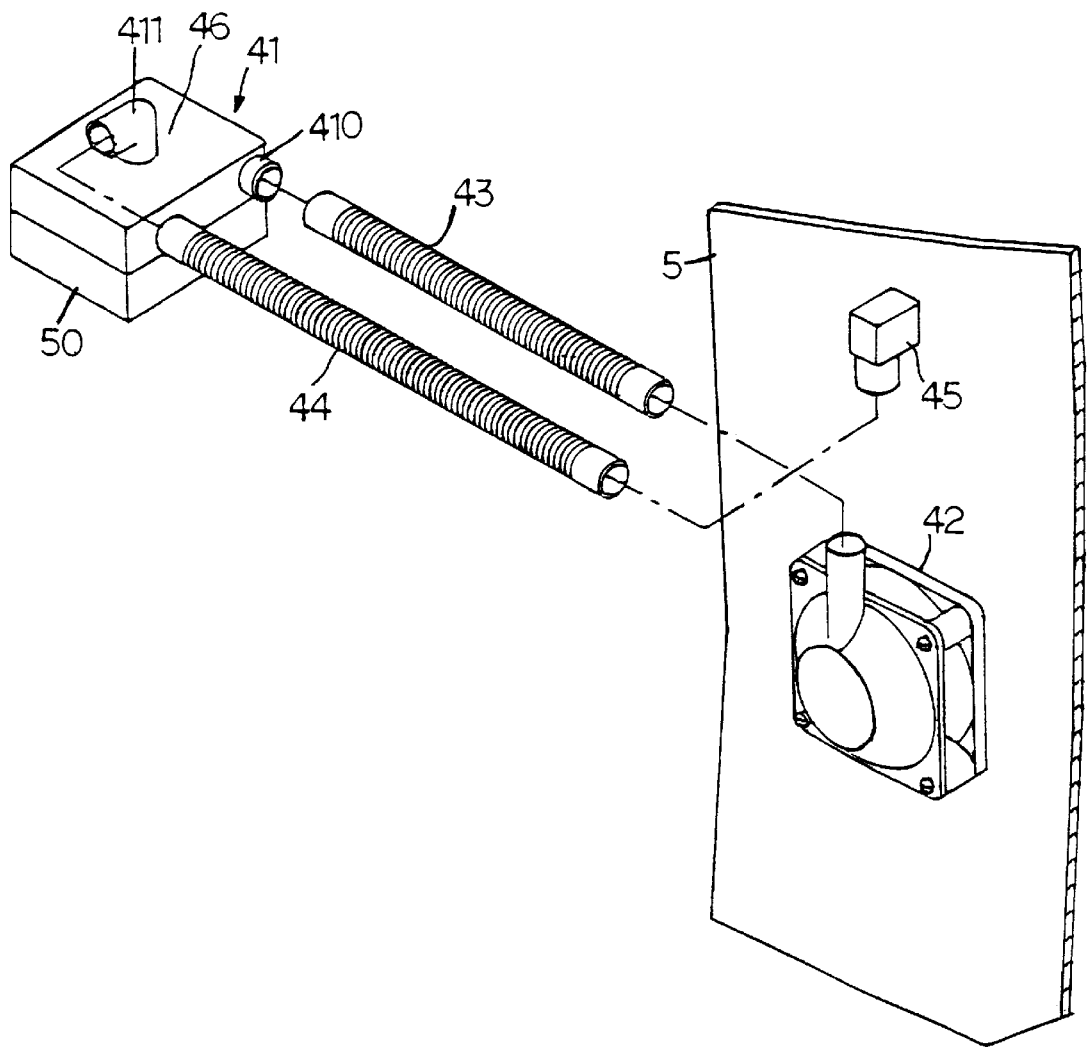
FIG. 3 is an exploded perspective view of a first embodiment of a heat exchange device for a heat source in the present invention.

A first embodiment of a heat exchange device 4 for a heat source in the present invention, as shown in FIG. 3, includes a case-shaped cover 41, an electric fan 42, an air-in tube 43 and an air-out tube 44 as main components combined together. What is called as a heat source 50 may be common electric or electronic circuit boards, IC, IC circuit boards, a CPU, any components producing heat, etc, in a very wide variety. Those heat sources have to be provided with heat exchange devices to keep them function normally and prolong their service life.

The case-shaped cover 41 is closely placed on a heat source 50 to draw away the heat produced by the heat source 50. An air inlet 410 is formed in a side wall and an air outlet 411 is formed in an upper wall of the cover 41. Further, a heat exchange stimulator 46 is fixed in the cover 41 to enhance heat exchange effect.

The air-in tube 43 has a first end connected to the air inlet 410 of the cover 41.

The electric fan 42 has an air outlet connected to the other end of the air-in tube 43, and fixed on an outer wall of the appliance having the heat source 50, a blowing outer cool air into the air-in tube 43 to the cover 41 to transmit and cool the heat produced by the heat source 50 while flowing around along the helical passageway formed by the heat exchange stimulator 46 in the cover 41, and finally exhausted out of the air outlet 411 of the cover 41 into the air-out tube 44 to outer open air. Thus, cool air blown into the cover 41 may stay a little longer by flowing around and around along a helical passageway 413 formed by a helical separating wall 412.

Figure 4:
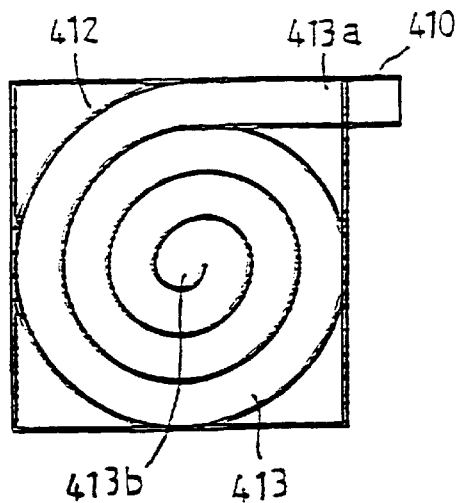
FIG. 4 is a cross-sectional view of a heat exchange stimulator fixed in a cover in the first embodiment in the present invention.

Next, as shown in FIG. 4, the heat exchange stimulator 46 fixed in the cover 41 has the helical separating plate 412 to form the helical passageway 413 for cool air coming from the fan 42 to flow around and around. The helical passageway 413 has a first end 413a communicating with the air inlet 410, and a second end 413b communicating with the air outlet 411. Therefore, cool air coming from the fan 42 can stay a little longer in the cover 41 before flowing out of the air outlet 411, probably functioning as a whirlwind to generate a definite flow speed to heighten heat dispersing effect.

Figure 5:
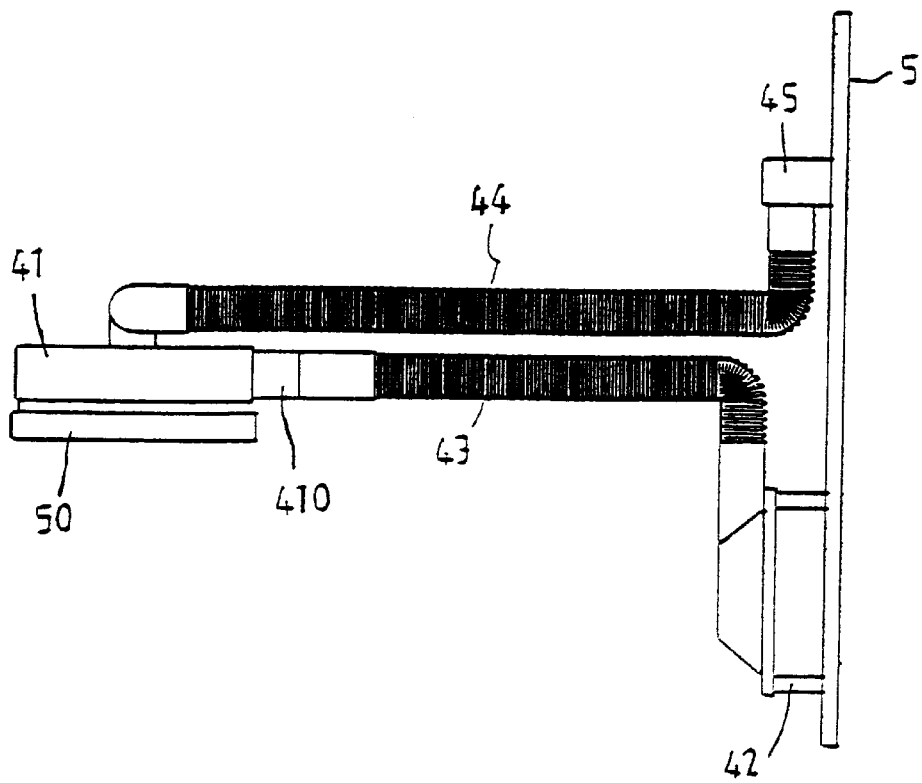
FIG. 5 is a side view of the first embodiment of a heat exchange device for a heat source being in use in the present invention; and, FIG. 6 is a side view of a second embodiment of a heat exchange device for a heat source being in use in the present invention.

As shown in FIG. 5, the heat exchange device 4 forms an air passageway via the fan 42, the air-in tube 43, the helical passageway 413, the air-out tube 44 and the wind outlet 45. The fan 42 draws in cool outer air into the air-in tube 43, and then into the air inlet 410 in the cover 41, circulating from the first end 413a to the second end 413b through the helical passageway 413, and then flowing out of the air outlet 411 through the air-out tube 44 and out of the wind outlet 45 to the outside of the case 5 of the appliance.

But the fan 42 can be used as a suction blower to suck out hot air in the case-shaped cover 41 through the air-in tube 43 and letting outer cool air flowing from the wind outlet 45 through the air-out tube 44, through the air outlet 411 into the case-shaped cover 41, performing the same heat exchanging function as described above.

Figure 6:
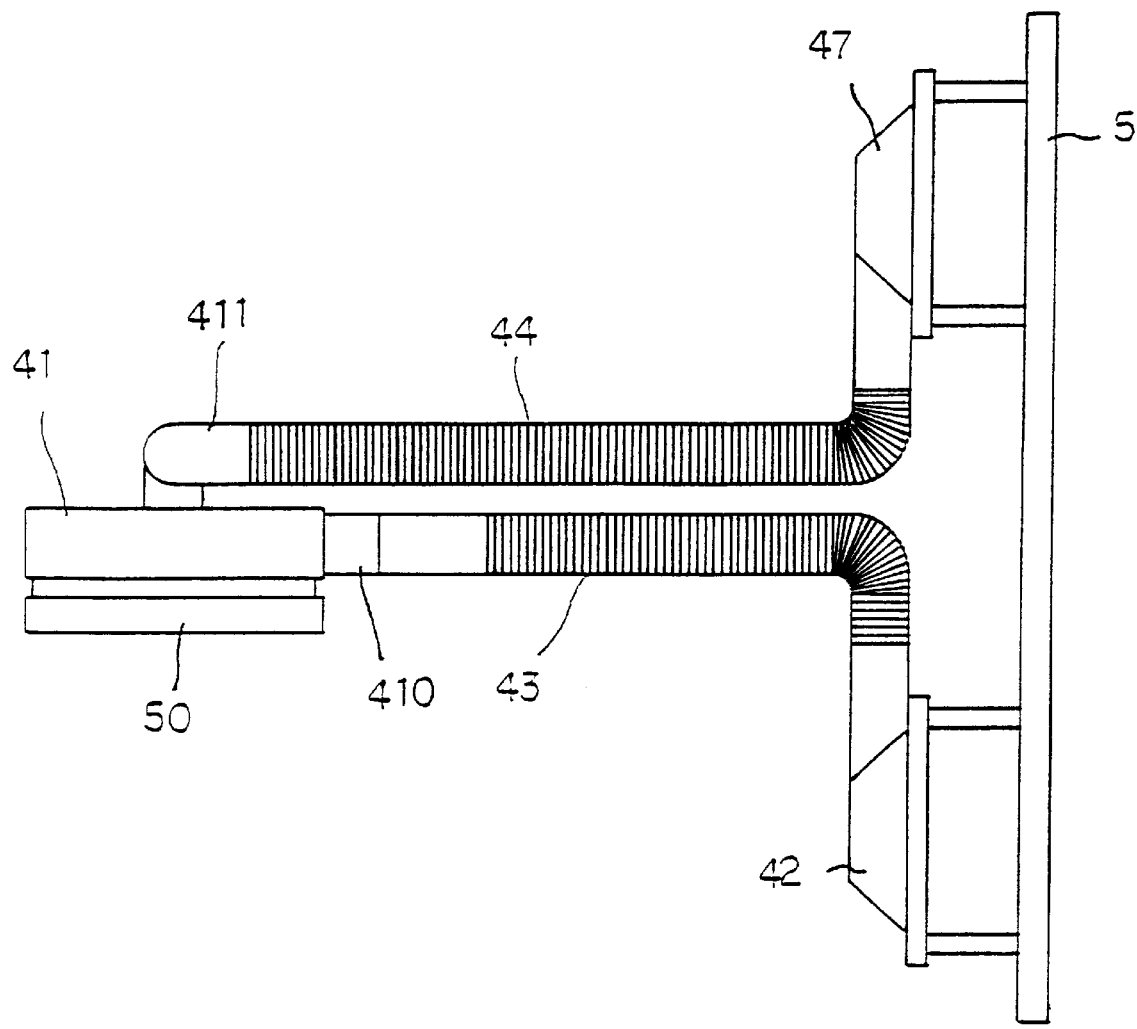

Next, FIG. 6 shows a second embodiment of a heat exchange device for a heat source, having almost the same structure as the first embodiment, except that an electric fan 47 is further provided at an outer end of the air-out tube 44 for quickly exhausting hot air in the cover 41 out of the air-out tube 44 to enhance fastness of heat exchange of the heat source 50.

As can be understood from the aforesaid description, the invention has the following advantages.

1. Outer cool air is blown by the fan 42 to flow through the air-in tube 43 to reach the cover 41, for assisting dispersing heat of a heat source 50, and heated air flowing in the cover 41 flows out of the air outlet 411 through the air-out tube 44 so that the heated up air in the case of an appliance with the heat source does not stay therein, dispersed by the cover 41 always cooled by outer cool air.

2. The helical passageway 413 formed in the cover 41 increases flowing distance for outer cool air coming from the fan 42, thus permitting it to flow around and around and stay a little longer in the cover 41 so that the cover 41 is cooled more to absorb more heat from the heat source. In addition, the helical passageway 413 also forms a whirlwind to increase pressure, leading to air current exchanging heat to flow smoothly, supplying cool air sufficiently to elevate the heat dispersing effect.

While the preferred embodiments of the invention have been described above, it will be recognized and understood that various modifications may be made therein and the appended claims are intended to cover all such modifications which may fall within the spirit and scope of the invention.

What is claimed is:

1. A heat exchange device for a heat source comprising:

a case-shaped cover having its lower wall directly contacting a heat source for exchanging heat;

an air-in tube having one end connected to said case-shaped cover;

a fan having a wind outlet connected to said air-in tube, fixed on an outer wall of said heat source;

an air-out tube having one end connected to said case-shaped cover, and the other end extending out of a case of an appliance of said heat source to outer air; and, said fan, said air-in tube, said case-shaped cover and said air-out tube making up a heat exchange route.

2. The heat exchange device for a heat source as claimed in claim 1, wherein said case-shaped cover has a heat exchange stimulator in its interior.

3. The heat exchange device for a heat source as claimed in claim 2, wherein said heat exchange stimulator is a helical separating plate.

4. The heat exchange device for a heat source as claimed in claim 1, wherein said case-shaped cover has an air inlet connected to said air-in tube.

5. The heat exchange device for a heat source as claimed in claim 1, wherein said case-shaped cover has an air outlet connected to said air-out tube.

6. The heat exchange device for a heat source as claimed in claim 1, wherein said air-out tube has its outer end connected to a fan.

* * * * *